(12) United States Patent
Roensch et al.

(10) Patent No.: US 9,249,925 B2
(45) Date of Patent: Feb. 2, 2016

(54) APPARATUS FOR MOUNTING A PHOTOVOLTAIC MODULE

(71) Applicant: UNIRAC, Inc., Albuquerque, NM (US)

(72) Inventors: Jonathan Roensch, Albuquerque, NM (US); Brian R. Hill, Albuquerque, NM (US); Nathan Schuit, Edgewood, NM (US); Erin Twitchell, Albuquerque, NM (US)

(73) Assignee: UNIRAC, Inc., Albuquerque, NM (US)

( * ) Notice: Subject to any disclaimer, the term of this patent is extended or adjusted under 35 U.S.C. 154(b) by 253 days.

(21) Appl. No.: 13/934,493

(22) Filed: Jul. 3, 2013

(65) Prior Publication Data

US 2015/0014496 A1    Jan. 15, 2015

(51) Int. Cl.
| | |
|---|---|
| *H02S 20/00* | (2014.01) |
| *F16M 13/02* | (2006.01) |
| *H01L 31/042* | (2014.01) |
| *F24J 2/52* | (2006.01) |
| *F24J 2/46* | (2006.01) |

(52) U.S. Cl.
CPC .............. *F16M 13/02* (2013.01); *F24J 2/5233* (2013.01); *F24J 2/5239* (2013.01); *F24J 2/5254* (2013.01); *F24J 2/5256* (2013.01); *H01L 31/0422* (2013.01); *F24J 2002/4661* (2013.01); *F24J 2002/5292* (2013.01)

(58) Field of Classification Search
CPC ......... Y02B 10/12; Y02E 10/50; H02S 20/00; F24J 2/5239
USPC .............................. 248/291.1, 292.12, 288.11
See application file for complete search history.

(56) References Cited

U.S. PATENT DOCUMENTS

| | | | |
|---|---|---|---|
| 5,316,592 A | 5/1994 | Dinwoodie | |
| 5,505,788 A | 4/1996 | Dinwoodie | |
| 5,746,839 A | 5/1998 | Dinwoodie | |
| 6,105,316 A | 8/2000 | Böttger et al. | |
| 6,534,703 B2 | 3/2003 | Dinwoodie | |
| 6,570,084 B2 | 5/2003 | Dinwoodie | |
| 6,809,251 B2 | 10/2004 | Dinwoodie | |
| 6,809,253 B2 | 10/2004 | Dinwoodie | |
| RE38,988 E | 2/2006 | Dinwoodie | |
| 7,921,843 B1 | 4/2011 | Rawlings | |
| 8,156,697 B2 | 4/2012 | Miros et al. | |
| 8,266,848 B2 | 9/2012 | Miros et al. | |
| 8,276,330 B2 * | 10/2012 | Harberts et al. | ............. 52/173.3 |

(Continued)

FOREIGN PATENT DOCUMENTS

| | | |
|---|---|---|
| DE | 10 2006 026 297 B3 | 8/2007 |
| EP | 1 833 098 A1 | 9/2007 |

OTHER PUBLICATIONS

Panelclaw, Grizzly Bear, Flat Roof Mounting Solution, 2 pages, 2013.

(Continued)

*Primary Examiner* — Jeanette E Chapman
*Assistant Examiner* — Daniel Kenny
(74) *Attorney, Agent, or Firm* — Crowell & Moring LLP

(57) ABSTRACT

An apparatus for mounting a photovoltaic module is disclosed. The apparatus includes a first support member, a second support member, a ballast support structure, and brackets. The brackets each include a first leg and a second leg, where the first leg includes a hook-shaped portion at a distal end of the first leg and the second leg includes a hook-shaped portion at a distal end of the second leg.

17 Claims, 15 Drawing Sheets

(56) References Cited

U.S. PATENT DOCUMENTS

| | | | |
|---|---|---|---|
| 8,558,101 B2* | 10/2013 | Mascolo et al. | 136/243 |
| 9,010,043 B2* | 4/2015 | Kanczuzewski et al. | 52/173.3 |
| 2005/0115176 A1 | 6/2005 | Russell | |
| 2005/0126621 A1 | 6/2005 | Dinwoodie et al. | |
| 2006/0053706 A1 | 3/2006 | Russell | |
| 2007/0144575 A1 | 6/2007 | Mascolo et al. | |
| 2007/0151594 A1 | 7/2007 | Mascolo et al. | |
| 2008/0068782 A1 | 3/2008 | Muchow et al. | |
| 2009/0242014 A1 | 10/2009 | Leary | |
| 2010/0179678 A1 | 7/2010 | Dinwoodie et al. | |
| 2011/0108083 A1 | 5/2011 | Ravestein et al. | |
| 2011/0278411 A1 | 11/2011 | Carbonare et al. | |
| 2012/0031469 A1 | 2/2012 | Loois et al. | |
| 2012/0211252 A1 | 8/2012 | Turziano et al. | |

OTHER PUBLICATIONS

Panelclaw, Polar Bear, Flat Roof Mounting Solution, 2 pages, 2014.
"IRONRIDGE Solar Mounting Made Simple", Parts Catalog, 2013 Edition, v1. 31, pp. 22-31 (11 pages total).
Canadian Examination Search Report issued in counterpart Application No. 2,851,936 dated Nov. 25, 2015 (Five (5) pages).

* cited by examiner

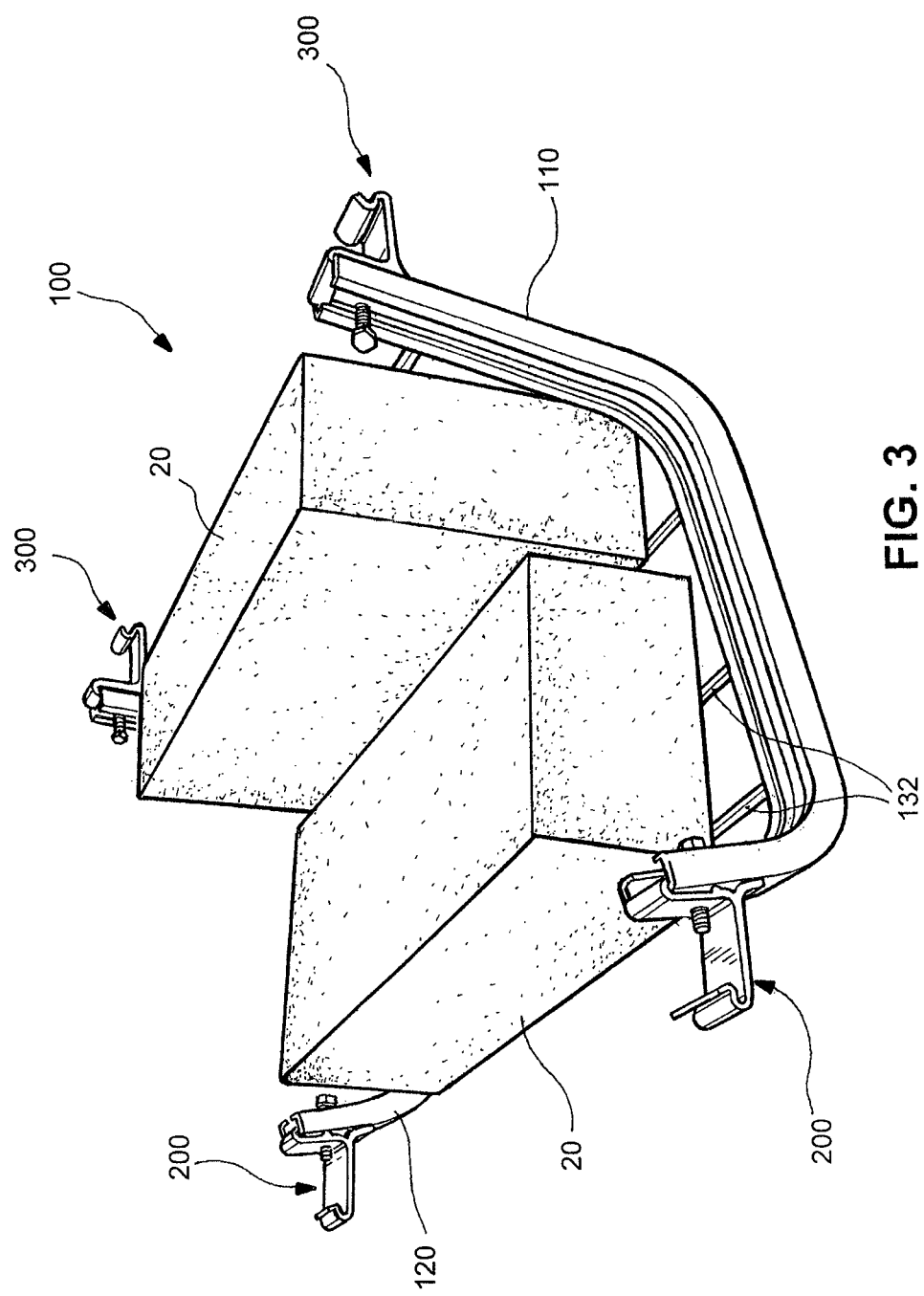

APPARATUS FOR MOUNTING A PHOTOVOLTAIC MODULE

BACKGROUND OF THE INVENTION

The solar industry is growing world-wide and, as a result, more-efficient structures are desirable for mounting a photovoltaic module to a structure, such as a roof of a home or other building. Whereas many different structures are known, there is a desire to reduce the complexity of such structures, and improve the efficiency of such structures.

Therefore, there is a need for an improved apparatus for mounting a photovoltaic module.

BRIEF DESCRIPTION OF THE DRAWINGS

FIG. 3 is a perspective view of the mounting apparatus including ballast;

DETAILED DESCRIPTION OF THE DRAWINGS

Figure 1:
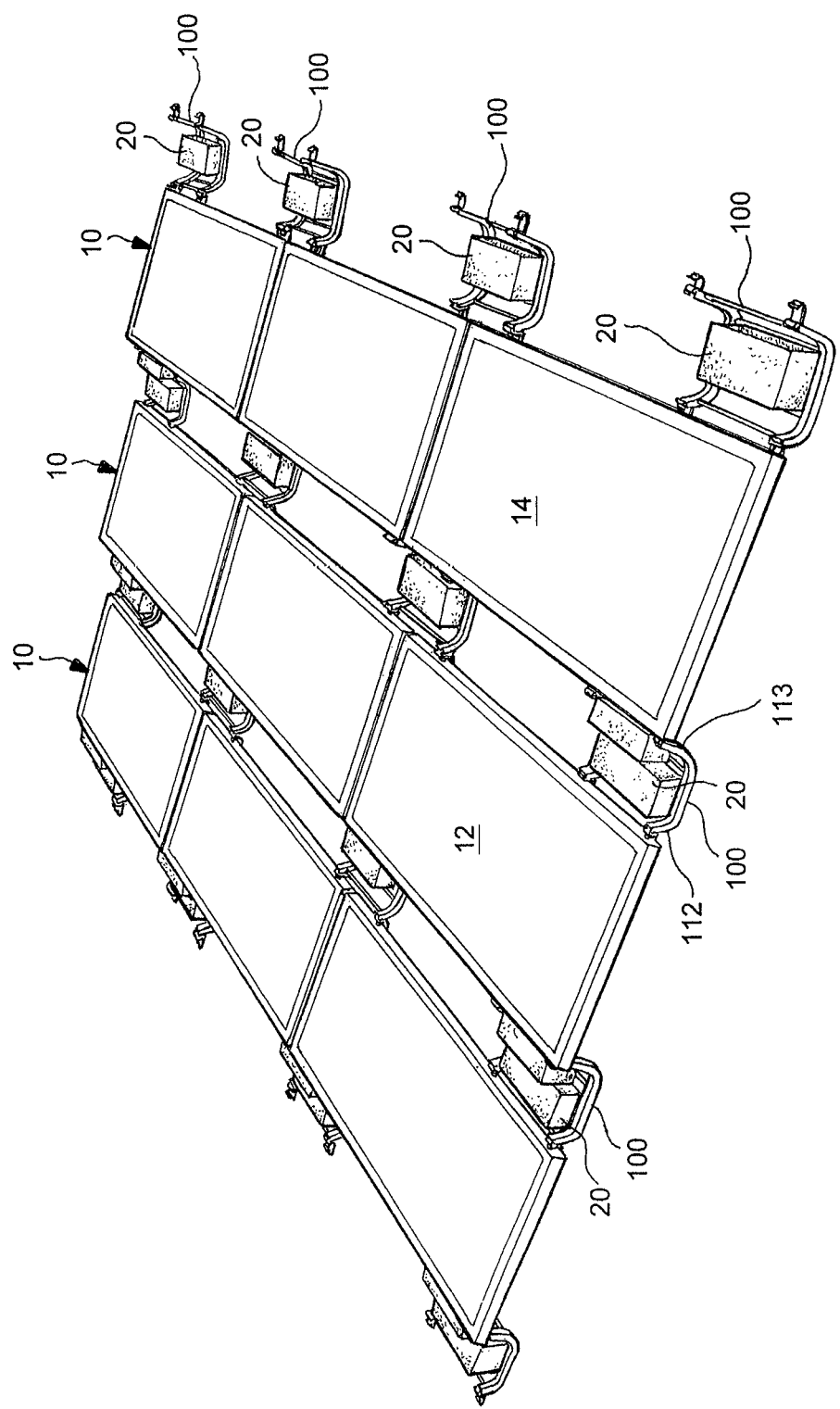
FIG. 1 is a perspective view of several apparatuses of the present invention as used to mount photovoltaic modules in accordance with an embodiment of the invention.

FIG. 1 is a perspective view of several apparatuses 100 for mounting photovoltaic (PV) modules 10 on a roof in accordance with an embodiment of the present invention. As will be further described below, a single apparatus 100 is used to mount a first PV module 12 at a first end of the apparatus and a second PV module 14 at a second end of the apparatus. Ballast 20 is provided in the apparatus 100 to retain the mounting apparatus 100, and correspondingly, the photovoltaic modules 10 on the surface of, for example, a roof, which is not shown.

Figure 2:
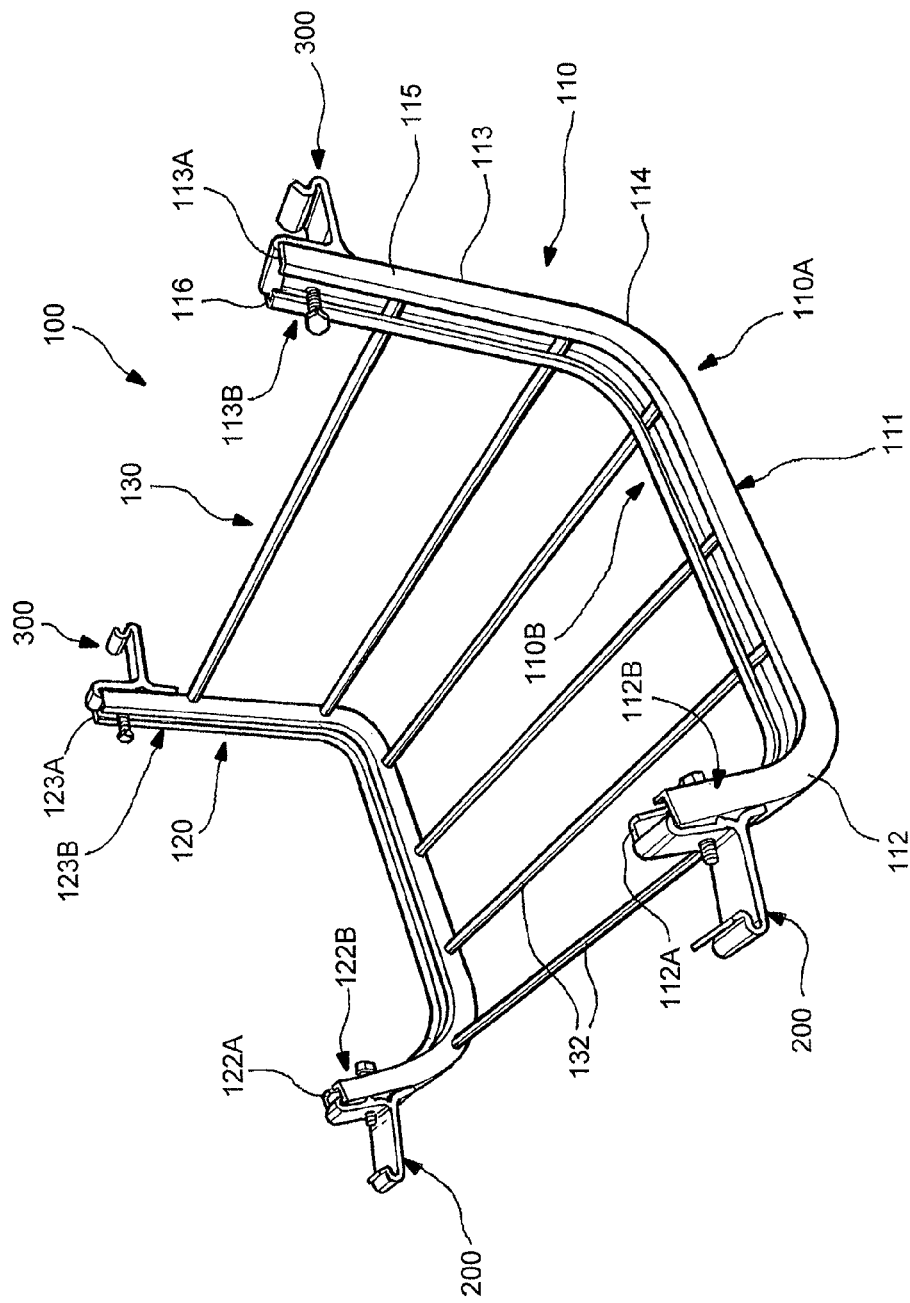
FIG. 2 is a perspective view of an embodiment of the mounting apparatus of the present invention.
Figure 5:
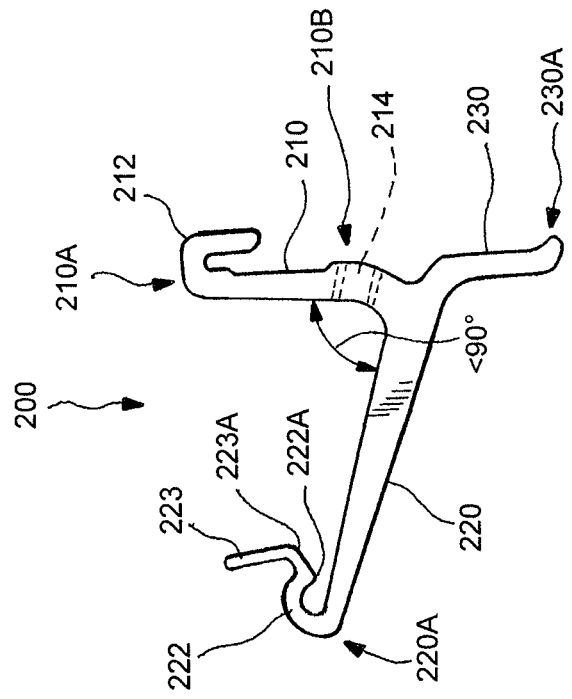
FIG. 5 is a side view of the bracket of FIG. 4.
Figure 4:
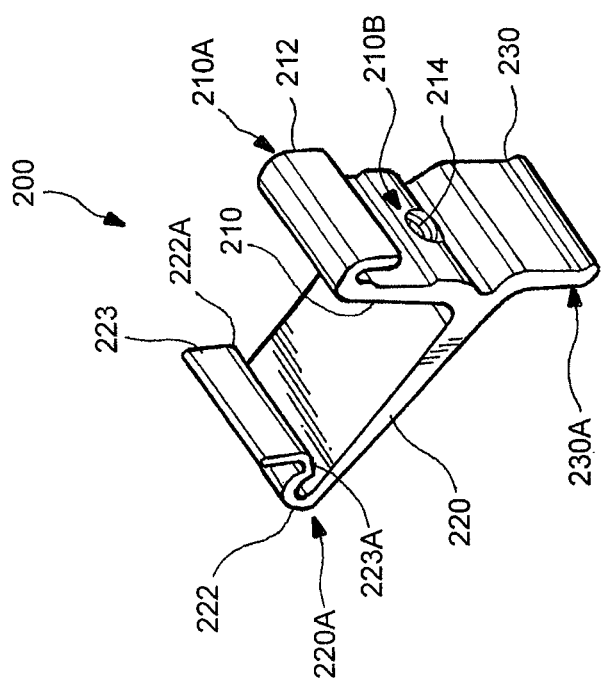
FIG. 4 is a perspective view of an embodiment of a bracket in accordance with the principles of the present invention.

As can be seen particularly in FIG. 2, the apparatus 100 includes a first support member 110 and a second support member 120. A ballast support structure 130 is disposed between the first support member 110 and the second support member 120. In this embodiment, the ballast support structure 130 is a plurality of spaced-apart rods 132 that extend between the first 110 and second 120 support members where respective ends of the rods are mounted in the support members. As discussed above, and as can be seen in FIG. 3, a ballast member(s) 20 is placed in the ballast support structure 130 and is supported in the ballast support structure 130 to retain the apparatus 100 on a surface. As can be further seen with reference to FIG. 1, with the apparatus 100, the ballast member 20 is located in the apparatus 100 between PV modules 12, 14 mounted in the apparatus 100, and thus, not under the PV modules. This provides for easier handling of the ballast member 20 with respect to the apparatus 100 and the PV modules. Additionally, with this configuration, the ballast shares the load between the PV modules 12, 14.

Since the first 110 and second 120 support members are similarly configured, a further description of one of the support members will be provided and this description equally applies to the other support member.

As such, in an embodiment, support member 110 is generally configured in a U-shaped. The support member 110 has a bottom leg 111 and two-upward extending legs 112, 113. In an operative configuration with a surface on which the support member 110 is mounted, the bottom leg 111 sits on the surface and the legs 112, 113 extend upward from the surface. As shown in FIG. 1, each of the legs 112, 113 receive a frame of a respective PV module to support the PV module on the surface.

As can also be seen, the first leg 112 may extend at a different angle from the bottom leg 111 than does the second leg 113. Further, the first leg 112 is generally shorter than the second leg 113. However, the present invention is not limited to any particular parameters for these dimensions and these parameters can be modified without departing from the spirit and scope of the invention. As can be understood, and as shown in FIG. 1, this configuration provides for an inclined angle for a PV module when mounted on adjacent apparatuses.

The cross-sectional configuration of the support member 110 is also generally U-shaped and includes a bottom member 114. The bottom member 114 is disposed on an outer periphery 110A of the support member 110. The bottom member 114 is generally a planar structure that is able to lie co-planar with, and on, the surface of the structure on which the apparatus 100 is mounted, e.g., a roof.

A first wall 115 and a second wall 116 extend from the bottom member 114 and the first and second walls 115, 116 extend into an inner periphery 110B of the support member 110. As such, the bottom member 114 and walls 115, 116 generally form the U-shaped structure where the area enclosed by the U-shaped structure is disposed on the inner periphery side of the first support member 110. As can be understood with this cross-sectional configuration, the bottom member 114 and walls 115, 116 extend all along the length of the support member 110.

As will be further discussed, a first distal end 112A and a second distal end 113A of first support member 110 each receive a respective bracket that is further used to mount PV modules on the apparatus 100. Similarly, a first distal end 122A and second distal end 123A of second support member 120 also each receive a respective bracket that is further used to mount PV modules on the apparatus 100

As can be seen in FIGS. 2 and 3, and with further reference to FIGS. 4-7, a respective first bracket 200 is disposed at both the first distal end 112A of the first support member 110 and the first distal end 122A of the second support member 120. A respective second bracket 300 is disposed at the second distal ends 113A, 123A of the respective first and second support members 110, 120.

As can be further seen in FIGS. 4-7, the first 200 and second 300 brackets are somewhat similarly configured. As can particularly be seen in FIGS. 4 and 5 for first bracket 200, first bracket 200 includes a first leg 210 and a second leg 220. The first leg 210 includes a hook-shaped portion 212 at a distal end 210A of the first leg and defines a threaded hole 214 at a proximal end 210B of the first leg 210. The second leg 220 also includes a hook-shaped portion 222 at a distal end 220A of the second leg 220. As can be further seen, first bracket 200 also includes a third leg 230. The third leg 230 extends in an opposite direction from the first leg 210 and the third leg 230 does not have a hook-shaped portion at a distal end 230A of the third leg.

In this embodiment, the hook-shaped portions 212, 222 of the respective legs 210, 220 of the first bracket 200 are also generally U-shaped. However, the present invention is not limited to this shape. All that is required is that a member is receivable within this structure. For example, this structure could be V-shaped, or any other shape that can perform the function of these portions of the respective legs. As will be further explained below, and as mentioned previously, a distal end of the support member is receivable within the hook-shaped portion 212 of the first leg 210 of the first bracket 200. A distal end of a frame of a PV module is receivable within the hook-shaped portion 222 of the second leg 220 of the first bracket 200.

As can be further seen, the second leg 220 of the first bracket 200 includes a cam surface 223 at a distal end 222A of the hook-shaped portion 222. This cam surface 223 is angled facing in an outward direction from the first leg 210. The cam surface 223 provides for ease in inserting the frame of a PV module into the bracket when mounting the frame in the bracket. The frame can be first positioned on, and then slid down, the cam surface 223. This assists in positioning the frame with respect to the bracket and inserting the frame within the bracket. This further assists in a similar manner when removing the frame from the bracket.

Further associated with the cam surface 223 and distal end 222A of the hook-shaped portion 222 is another surface 223A that provides a transition between the cam surface 223 and hook-shaped portion 222. This structure also assists in guiding and positioning the frame within the bracket, and correspondingly, removing the frame from the bracket.

Figure 7:
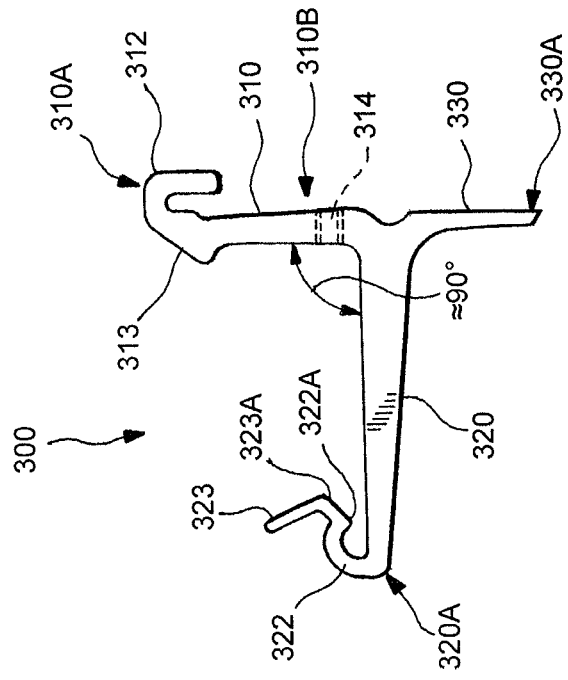
FIG. 7 is a side view of the bracket of FIG. 6.
Figure 6:
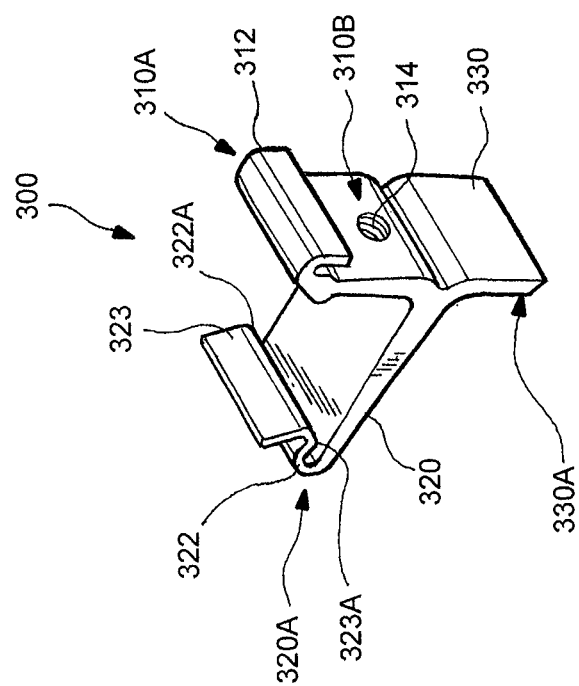
FIG. 6 is a perspective view of an embodiment of a second bracket in accordance with the principles of the present invention.

Second bracket 300, as mentioned above, is generally configured similarly to first bracket 200 and can be particularly seen in FIGS. 6 and 7. Thus, second bracket 300 also includes a first leg 310 and a second leg 320. The first leg 310 includes a hook-shaped portion 312 at a distal end 310A of the first leg and defines a threaded hole 314 at a proximal end 310B of the first leg 310. The second leg 320 also includes a hook-shaped portion 322 at a distal end 320A of the second leg 320. Second bracket 300 also includes a third leg 330. The third leg 330 extends in an opposite direction from the first leg 310 and the third leg 330 does not have a hook-shaped portion at a distal end 330A of the third leg.

As with the hook-shaped portions 212, 222 of the respective legs 210, 220 of the first bracket 200, the hook-shaped portions 312, 322 of the respective legs 310, 320 of the second bracket 300 are also generally U-shaped. However, as discussed above, the present invention is not limited to this shape. As will be further explained below, and as also previously mentioned, a second distal end of the support member is receivable within the hook-shaped portion 312 of the first leg 310 of the second bracket 300 and a distal end of a frame of a second PV module is receivable within the hook-shaped portion 322 of the second leg 320 of the second bracket 300.

Also similarly, the second leg 320 of the second bracket 300 includes a cam surface 323 at a distal end 322A of the hook-shaped portion 322. This cam surface 323 is also angled facing in an outward direction from the first leg 310. The cam surface 323 provides for the same functionality as discussed above with respect to cam surface 223 of first bracket 200.

Further, associated with the cam surface 323 and distal end 322A of the hook-shaped portion 322, is another surface 323A that provides a transition between the cam surface 323 and hook-shaped portion 322. This structure also provides the same functionality as discussed above with respect to the corresponding structure of the first bracket 200.

Whereas the first bracket 200 and the second bracket 300 are somewhat similarly configured, a difference between the two brackets is the angle of the second legs 220, 320 with respect to the respective first legs 210, 310. As can be particularly seen in FIGS. 4 and 5 as compared to FIGS. 6 and 7, the second legs 220, 320 of the respective first and second brackets 200, 300 are disposed at different angles from the respective first legs 210, 310. As can be seen particularly in FIG. 5, the second leg 220 of first bracket 200 is disposed at an angle of less than 90° from the first leg 210 of the first bracket 200. And, as can be particularly seen in FIG. 7, the second leg 320 of the second bracket 300 is disposed at an angle of substantially 90° from the first leg 310 of the second bracket 300. As can be understood, these differences in the angles for the brackets are associated with the other parameters of the mounting apparatus, e.g., angle and length of the legs of the support members.

A further difference between the two brackets 200, 300 is that second bracket 300 also includes a cam surface 313 at the distal end 310A of the first leg 310. This cam surface 313 can also provide for assisting in guiding and positioning the PV module frame within the bracket, and correspondingly, removing the frame from the bracket.

Figure 8:
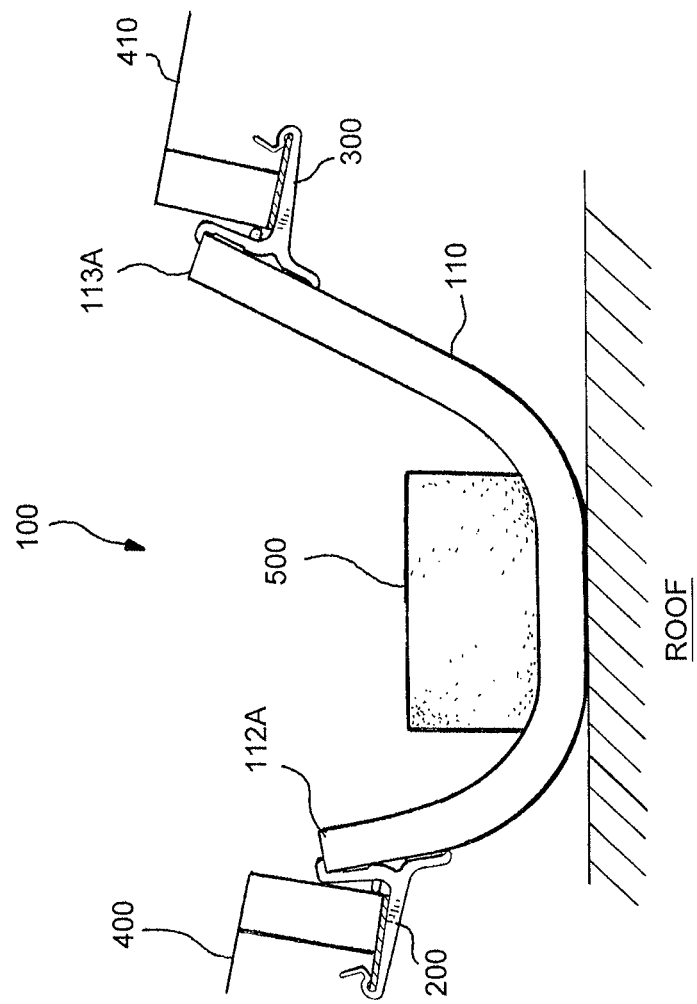
FIG. 8 is a side view of the mounting apparatus with two solar panels.

FIG. 8 illustrates the mounting apparatus 100 in an operative configuration with two PV panels 400, 410. In this side view, only a single support member, i.e., support member 110, with a first bracket 200 and a second bracket 300 is illustrated. However, as can be understood, in this operative configuration, a similarly configured second support member 120, with respective first and second brackets 200, 300, is also used in mounting PV panels 400, 410.

As can be seen, a first bracket 200 is disposed at the first distal end 112A of first support member 110 and a second bracket 300 is disposed at the second distal end 113A of the first support member 110. The frame of first PV module 400 is received within first bracket 200 and the frame of second PV module 410 is received with second bracket 300. Ballast member 500 is provided in the apparatus 100 to retain the mounting apparatus 100, and correspondingly, the photovoltaic modules 400, 410 on the surface of, for example, a roof.

Figure 9:
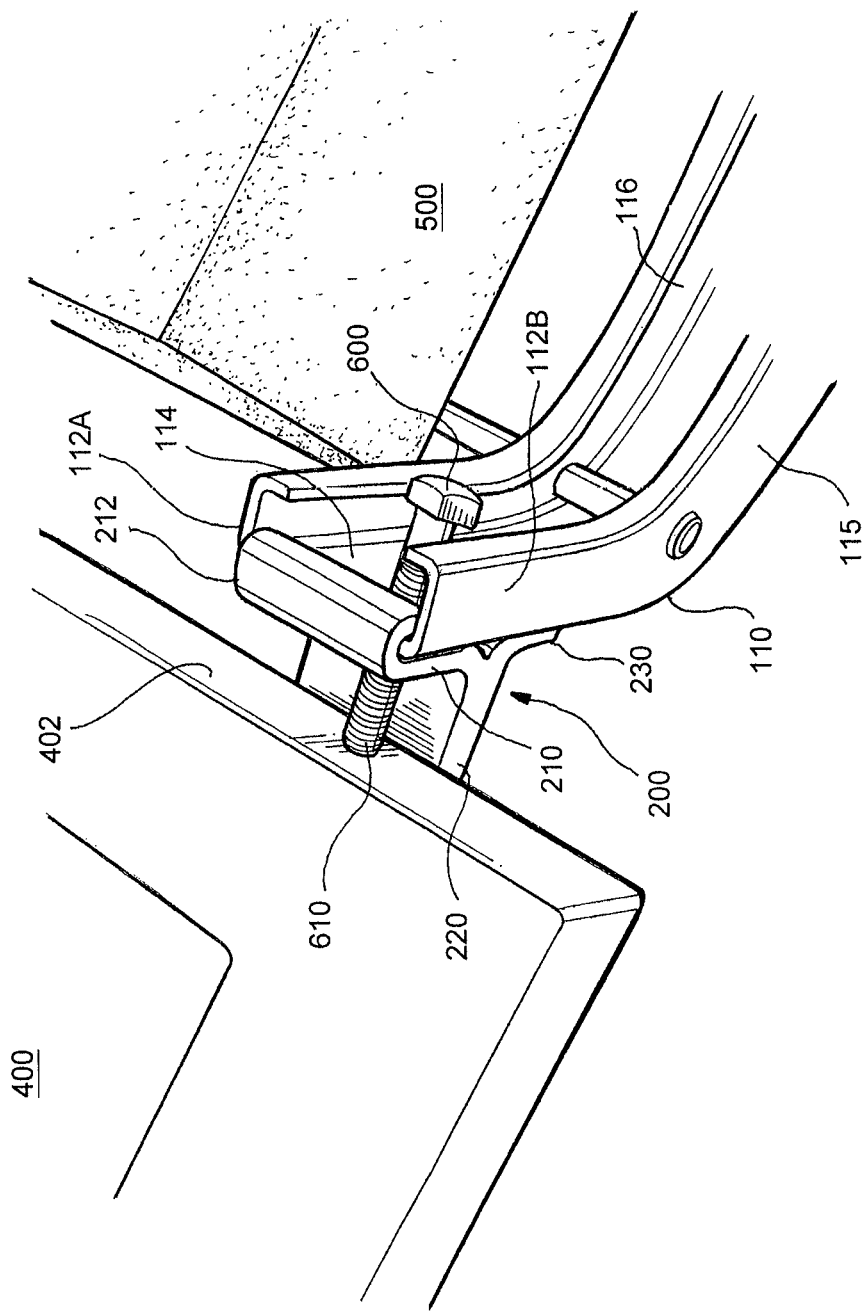
FIG. 9 is a perspective view of the mounting apparatus with a solar panel.
Figure 10:
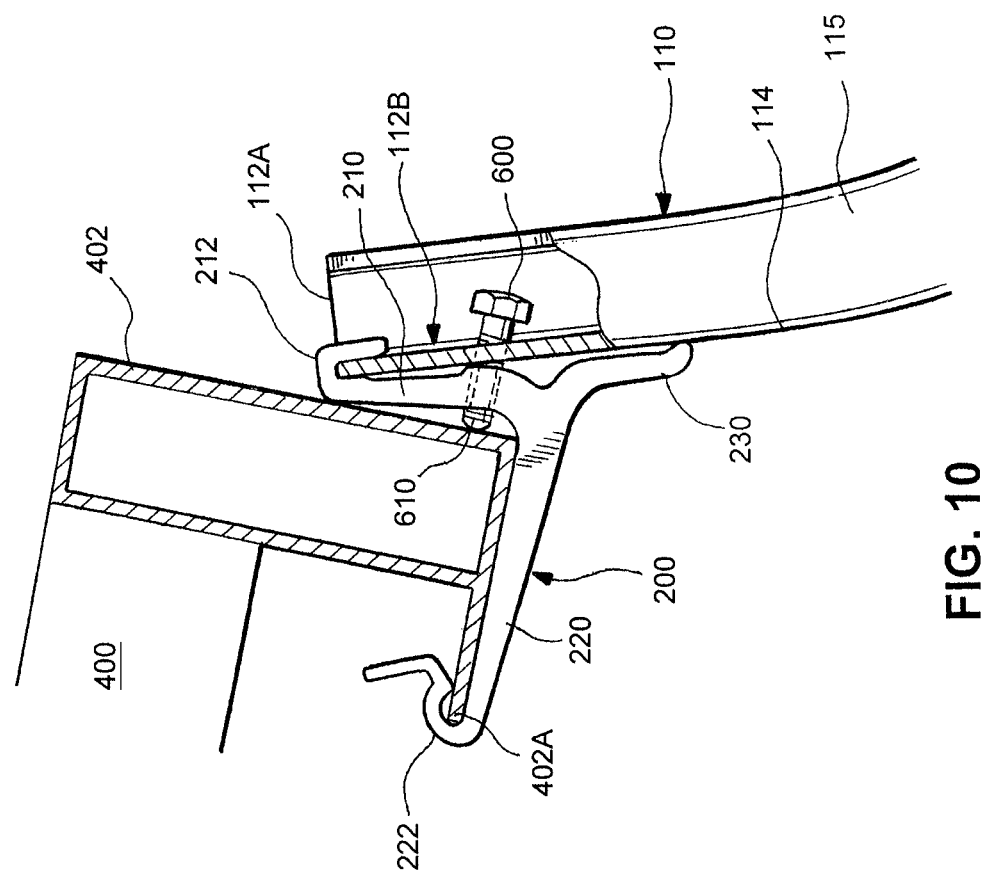
FIG. 10 is a side view of the mounting apparatus with a solar panel.

Reference is made to FIGS. 9 and 10 for more-particularly describing the operative configuration between the support members, the brackets, and the PV modules. In FIGS. 9 and 10, only one of the support members, brackets, and PV modules is illustrated, however, as can be understood, this operative configuration is applicable equally as well to the other support member, brackets, and PV module.

As can be seen, to mount the first bracket 200 onto the first support member 110, first the hook-shaped portion 212 of the first leg 210 of the first bracket 200 is slid, and optionally snapped, onto the bottom member 114 of the first support member 110 at the first distal end 112A of the first support member 110. Then, an engagement member 600, which may be a threaded bolt, is used to further secure the first bracket 200 onto the first support member 110. The engagement member 600 is disposed through a hole defined by the first distal portion 112B of the first support member 110 and the threaded hole 214 in the first leg 210 of the first bracket 200. The hole defined by the first distal portion 112B is unthreaded and is disposed within bottom member 114. As can be further seen, the engagement member 600 has a head that is located remote from the PV module 400, i.e., on a side of bottom member 114 that is opposite from the PV module 400.

In this operative configuration between the first bracket 200 and the first support member 110, the first leg 210 and third leg 230 of the first bracket 200 extend substantially along, and in contact with, at least in part, the bottom member 114 at the first distal portion 112B of the first support member 110. This configuration of the bracket with respect to the support member allows the bracket 200 to resist rotation in the vertical direction, i.e., in a direction substantially perpendicular to the planar surface on which the apparatus 100 is mounted.

As can be further seen in FIGS. 9 and 10, PV module 400 is disposed in bracket 200. The frame member 402 of PV module 400 is disposed in bracket 200 and a distal end 402A of frame member 402 is secured in hook-shaped portion 222 of second leg 220 of first bracket 200.

To further secure frame member 402 of PV module 400 in bracket 200, the engagement member 600 is further extended through first support member 110 and bracket 200. In this further extended position for engagement member 600, a distal end 610 of engagement member 600 engages with frame member 402 of PV module 400. This further secures distal end 402A of frame member 402 in hook-shaped portion 222 of bracket 200.

Because an engagement member 600 is further utilized, the bracket does not need to be sized for any particular size PV module frame. The frame is placed in the bracket and then any spacing between the frame and the first leg 210 of the bracket can be accommodated for by the engagement member 600. Thus, the PV module frame does not have to engage with first leg 210 of the bracket. If the PV module frame does not engage with the first leg, the bolt further serves as a constraining surface for the frame in the bracket.

FIG. 9 illustrates a spaced relationship between the PV module frame 402 and the first leg 210 of bracket 200 with the engagement member 600 engaging PV frame 402. FIG. 10 illustrates an adjacent relationship between the PV module frame 402 and the first leg 210 of bracket 200, again with the engagement member 600 engaging PV frame 402

Thus, as discussed above, the "bucket shape" of the brackets formed by the first and second legs allows for accommodating PV frames of different thicknesses and also allows for thermal expansion of the legs.

Additionally, the contact between engagement member 600 and PV module frame 402 can result in engagement member 600 penetrating the annodization of the PV module frame, and as such, providing for PV module frame electrical bonding through the apparatus. The engagement member 600 does not penetrate the wall of the PV module frame.

Further, with the brackets of the present invention, the entire forces associated with securing the PV frames in the brackets are loaded onto the brackets. There is no load sharing with the support members, which provides for efficiencies in the design of the different components.

Figure 11:
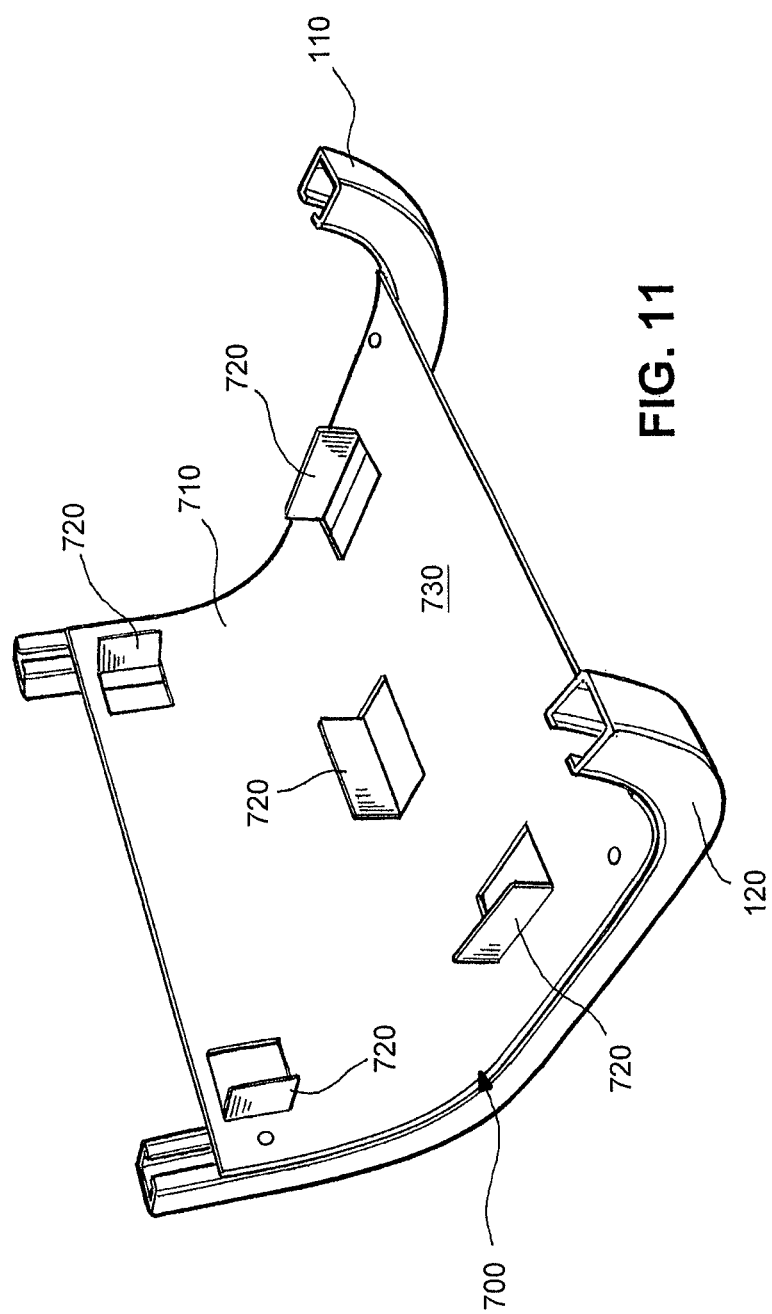
FIG. 11 is a perspective view of an alternative embodiment of a ballast support structure in accordance with the principles of the present invention.

FIG. 11 illustrates an alternative embodiment for a ballast support structure 700 in accordance with the principles of the present invention. In this embodiment, the ballast support structure 700 is a plate 710 that extends between the first and second support structures 110, 120. Plate 710 can include formed tabs 720 that extend from a surface 730 of the plate 710. The tabs 720 engage with ballast to position the ballast on the plate 710 of the ballast support structure 700.

Figure 12:
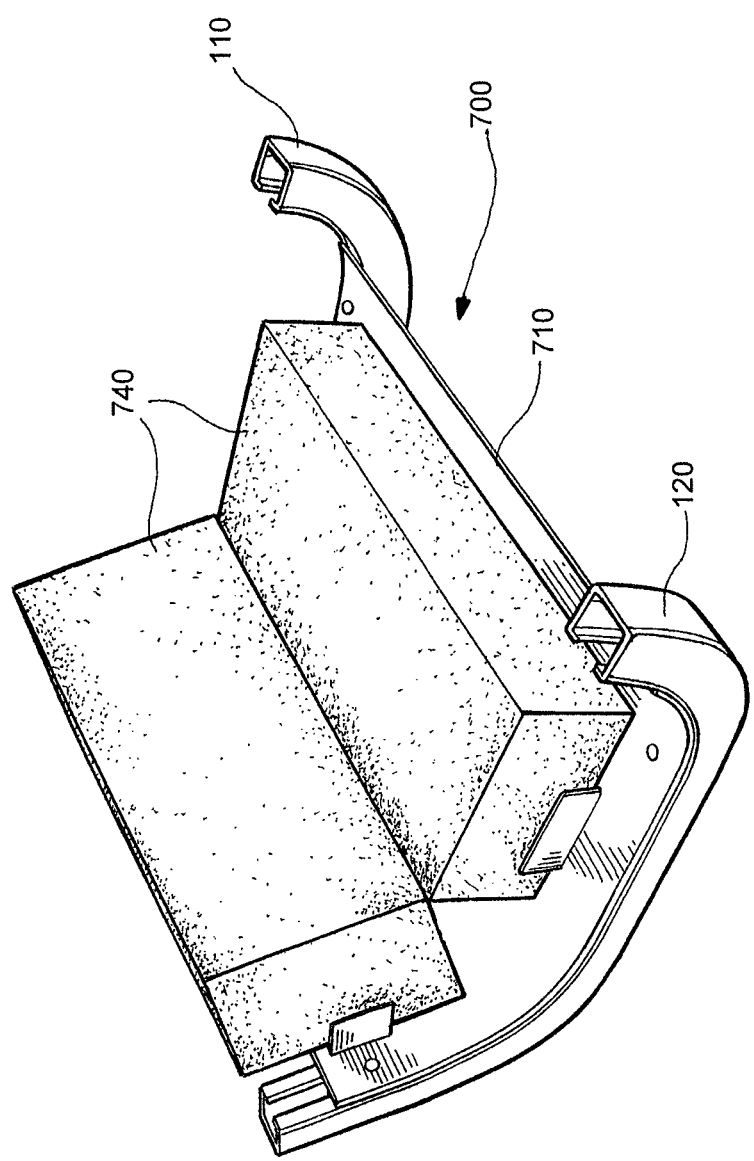
FIG. 12 is a perspective view of the embodiment of FIG. 11 of the ballast support structure with ballast.

FIG. 12 illustrates the ballast support structure 700 of FIG. 11 with ballast members 740 disposed on the ballast support structure 700.

Figure 13:
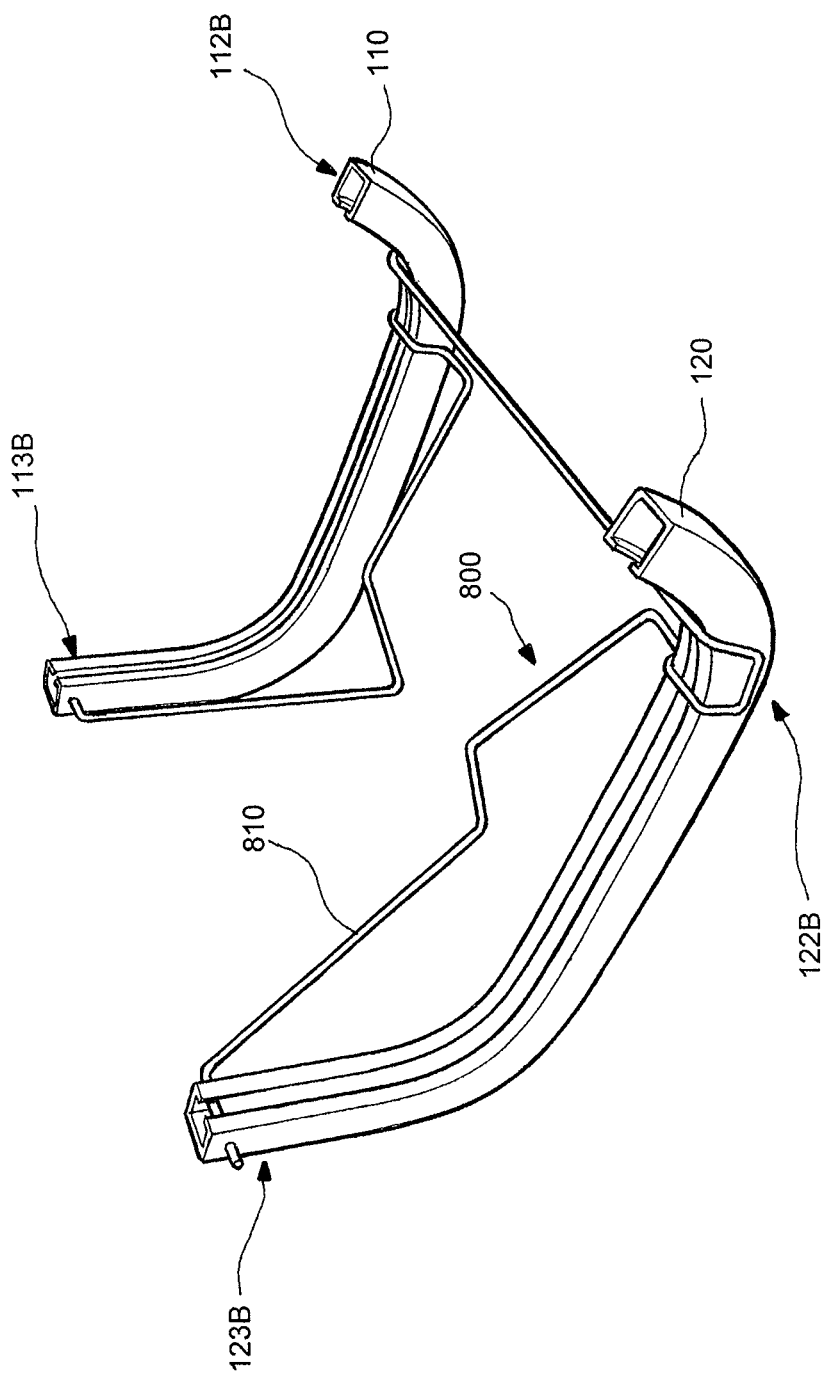
FIG. 13 is a perspective view of a second alternative embodiment of a ballast support structure in accordance with the principles of the present invention.
Figure 14:
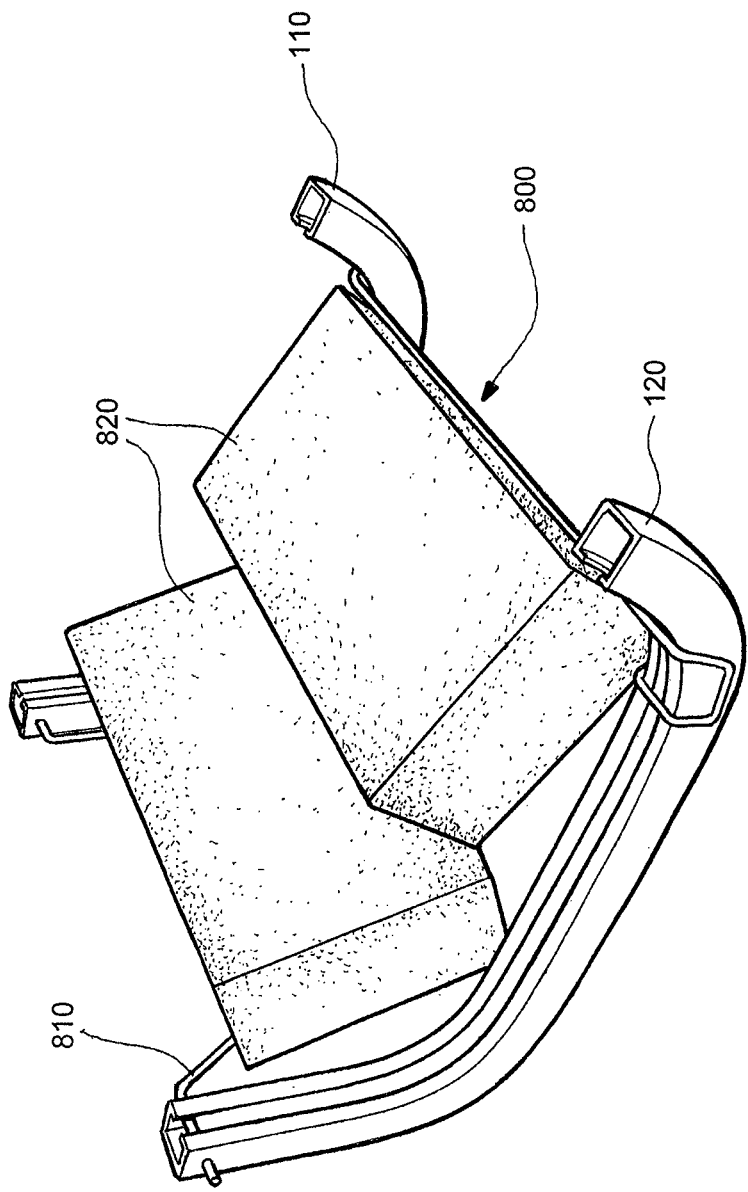
FIG. 14 is a perspective view of the embodiment of FIG. 13 of the ballast support structure with ballast.

FIG. 13 illustrates a second alternative embodiment for a ballast support structure 800 in accordance with the principles of the present invention. In this embodiment, the ballast support structure 800 is a contiguous rod 810 that is attached at the first and second distal portions 112B, 113B of the first support member 110 and at the first and second distal portions 122B, 123B of the second support member 120. FIG. 14 illustrates the ballast support structure 800 of FIG. 13 with ballast members 820 disposed on the contiguous rod 810.

Figure 15:
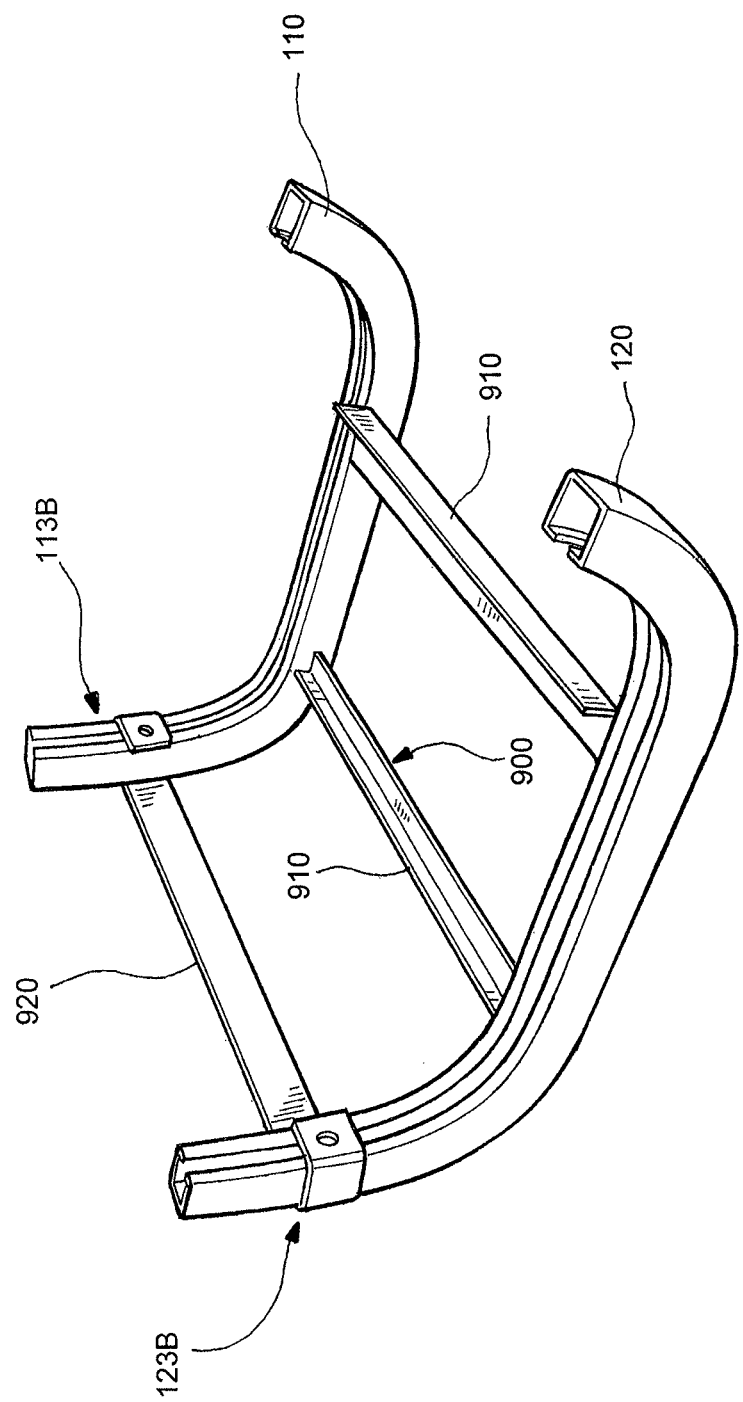
FIG. 15 is a perspective view of a third alternative embodiment of a ballast support structure in accordance with the principles of the present invention.
Figure 16:
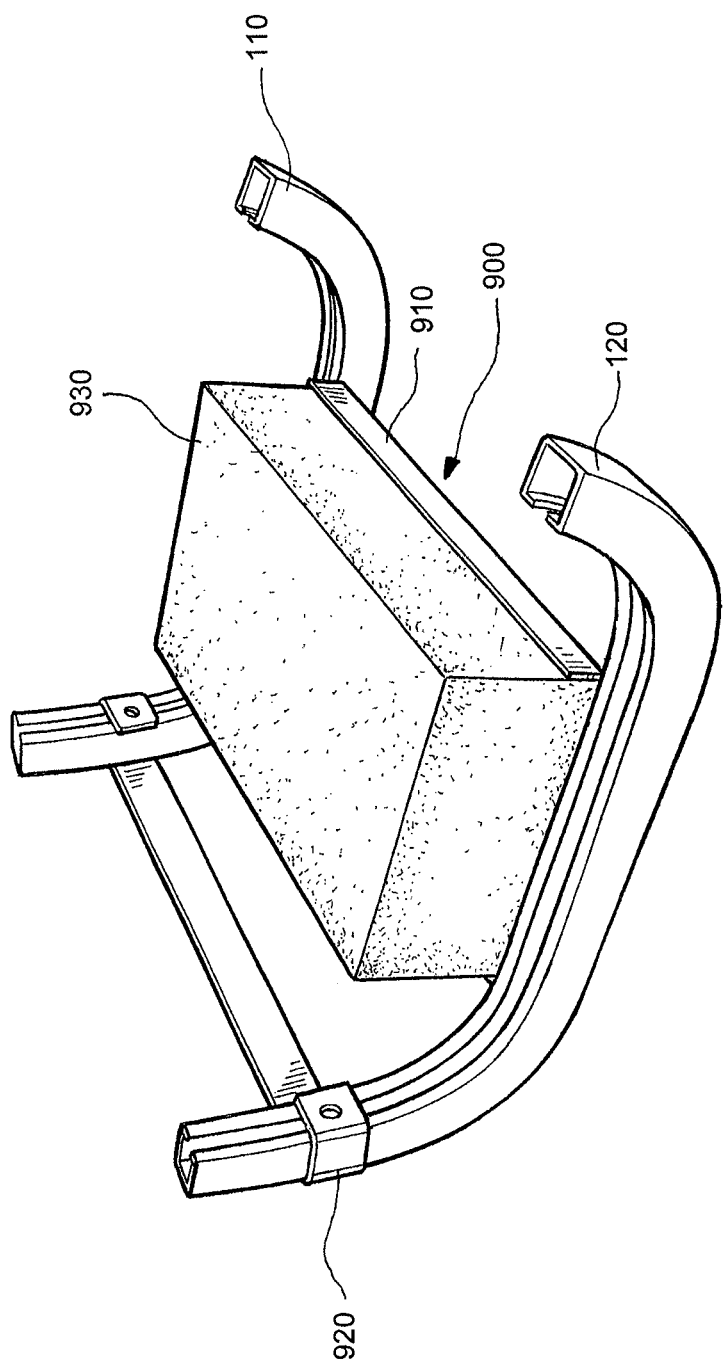
FIG. 16 is a perspective view of the embodiment of FIG. 15 of the ballast support structure with ballast.

FIG. 15 illustrates a third alternative embodiment for a ballast support structure 900 in accordance with the principles of the present invention. In this embodiment, the ballast support structure 900 includes a pair of spaced-apart L-shaped members 910 that extend between the first and second support members 110, 120. The ballast support structure 900 may also include a flat member 920 that extends across the first and second support members 110, 120 at the respective second distal portions 113B, 123B of the support members. This flat member 920 does not necessarily support a ballast member, but rather, can provide for stability between the support members at their second distal portions. FIG. 16 illustrates the ballast support structure 900 of FIG. 15 with a ballast member 930 disposed on the ballast support structure 900.

Figure 17:
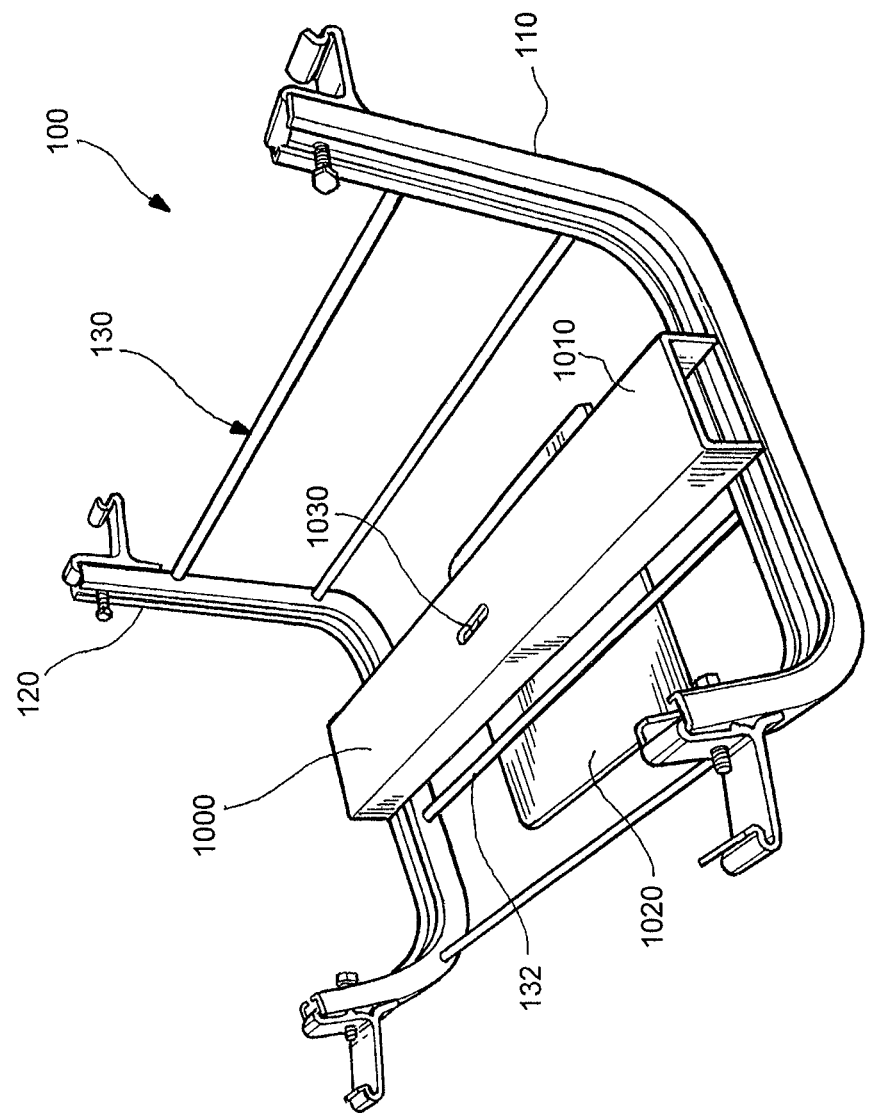
FIG. 17 illustrates a roof penetration structure in accordance with the principles of the present invention.

FIG. 17 illustrates the apparatus 100 with a roof penetration structure 1000 extending between the first and second support members 110, 120. The roof penetration structure 1000 includes a support member 1010 and a plate 1020. In this embodiment, a rod(s) 132 of the ballast support structure 130 is disposed between the support member 1010 and the plate 1020. This configuration serves to secure the roof penetration structure 1000 onto the apparatus 100. The plate 1020 can rest on the surface of the structure on which the apparatus is placed. A ballast member can be associated with the support member 1010.

The support member 1010 and plate 1020 each define a respective hole 1030 therein (hole 1030 in plate 1020 is not visible). The holes are aligned such that a securement member (not shown) can be disposed through the aligned holes, and thus through the apparatus 100, and into the surface on which the apparatus is placed to further secure the apparatus to the surface.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An apparatus for mounting a photovoltaic module, comprising:
   a first support member;
   a second support member;

a ballast support structure, wherein the ballast support structure is disposed between the first support member and the second support member;

a first bracket, wherein the first bracket includes a first leg and a second leg, wherein the first leg includes a hook-shaped portion at a distal end of the first leg, wherein the second leg includes a hook-shaped portion at a distal end of the second leg, and wherein a first distal end of the first support member is disposable in the hook-shaped portion of the first leg of the first bracket;

a second bracket, wherein the second bracket includes a first leg and a second leg, wherein the first leg includes a hook-shaped portion at a distal end of the first leg, wherein the second leg includes a hook-shaped portion at a distal end of the second leg, and wherein a second distal end of the first support member is disposable in the hook-shaped portion of the first leg of the second bracket;

a third bracket, wherein the third bracket includes a first leg and a second leg, wherein the first leg includes a hook-shaped portion at a distal end of the first leg, wherein the second leg includes a hook-shaped portion at a distal end of the second leg, and wherein a first distal end of the second support member is disposable in the hook-shaped portion of the first leg of the third bracket; and a fourth bracket, wherein the fourth bracket includes a first leg and a second leg, wherein the first leg includes a hook-shaped portion at a distal end of the first leg, wherein the second leg includes a hook-shaped portion at a distal end of the second leg, and wherein a second distal end of the second support member is disposable in the hook-shaped portion of the first leg of the fourth bracket;

wherein the hook-shaped portions of the respective legs are generally U-shaped.

2. The apparatus according to claim 1:

wherein the second leg of the first bracket is disposed at an angle of less than 90° from the first leg of the first bracket;

and wherein the second leg of the third bracket is disposed at an angle of less than 90° from the first leg of the third bracket.

3. The apparatus according to claim 1, wherein the ballast support structure is a plate that extends between the first and second support members.

4. An apparatus for mounting a photovoltaic module, comprising:

a first support member;

a second support member;

a ballast support structure, wherein the ballast support structure is disposed between the first support member and the second support member;

a first bracket, wherein the first bracket includes a first leg and a second leg, wherein the first leg includes a hook-shaped portion at a distal end of the first leg, wherein the second leg includes a hook-shaped portion at a distal end of the second leg, and wherein a first distal end of the first support member is disposable in the hook-shaped portion of the first leg of the first bracket;

a second bracket, wherein the second bracket includes a first leg and a second leg, wherein the first leg includes a hook-shaped portion at a distal end of the first leg, wherein the second leg includes a hook-shaped portion at a distal end of the second leg, and wherein a second distal end of the first support member is disposable in the hook-shaped portion of the first leg of the second bracket;

a third bracket, wherein the third bracket includes a first leg and a second leg, wherein the first leg includes a hook-shaped portion at a distal end of the first leg, wherein the second leg includes a hook-shaped portion at a distal end of the second leg, and wherein a first distal end of the second support member is disposable in the hook-shaped portion of the first leg of the third bracket; and a fourth bracket, wherein the fourth bracket includes a first leg and a second leg, wherein the first leg includes a hook-shaped portion at a distal end of the first leg, wherein the second leg includes a hook-shaped portion at a distal end of the second leg, and wherein a second distal end of the second support member is disposable in the hook-shaped portion of the first leg of the fourth bracket;

wherein the first legs of the respective brackets each define a hole.

5. The apparatus according to claim 4, further comprising:

a first engagement member disposable though the hole of the first leg of the first bracket and a hole defined at a first distal portion of the first support member;

a second engagement member disposable though the hole of the first leg of the second bracket and a hole defined at a second distal portion of the first support member;

a third engagement member disposable though the hole of the first leg of the third bracket and a hole defined at a first distal portion of the second support member; and a fourth engagement member disposable though the hole of the first leg of the fourth bracket and a hole defined at a second distal portion of the second support member.

6. The apparatus according to claim 5, wherein the respective engagement members are bolts.

7. An apparatus for mounting a photovoltaic module, comprising:

a first support member;

a second support member;

a ballast support structure, wherein the ballast support structure is disposed between the first support member and the second support member;

a first bracket, wherein the first bracket includes a first leg and a second leg, wherein the first leg includes a hook-shaped portion at a distal end of the first leg, wherein the second leg includes a hook-shaped portion at a distal end of the second leg, and wherein a first distal end of the first support member is disposable in the hook-shaped portion of the first leg of the first bracket;

a second bracket, wherein the second bracket includes a first leg and a second leg, wherein the first leg includes a hook-shaped portion at a distal end of the first leg, wherein the second leg includes a hook-shaped portion at a distal end of the second leg, and wherein a second distal end of the first support member is disposable in the hook-shaped portion of the first leg of the second bracket;

a third bracket, wherein the third bracket includes a first leg and a second leg, wherein the first leg includes a hook-shaped portion at a distal end of the first leg, wherein the second leg includes a hook-shaped portion at a distal end of the second leg, and wherein a first distal end of the second support member is disposable in the hook-shaped portion of the first leg of the third bracket; and a fourth bracket, wherein the fourth bracket includes a first leg and a second leg, wherein the first leg includes a hook-shaped portion at a distal end of the first leg, wherein the second leg includes a hook-shaped portion at a distal end of the second leg, and wherein a second distal end of the second support member is disposable in the hook-shaped portion of the first leg of the fourth bracket;

wherein the first bracket includes a third leg, wherein the third leg extends in an opposite direction from the first leg, and wherein the third leg does not have a hook-shaped portion at a distal end of the third leg;

wherein the second bracket includes a third leg, wherein the third leg extends in an opposite direction from the first leg, and wherein the third leg does not have a hook-shaped portion at a distal end of the third leg;

wherein the third bracket includes a third leg, wherein the third leg extends in an opposite direction from the first leg, and wherein the third leg does not have a hook-shaped portion at a distal end of the third leg;

and wherein the fourth bracket includes a third leg, wherein the third leg extends in an opposite direction from the first leg, and wherein the third leg does not have a hook-shaped portion at a distal end of the third leg.

8. The apparatus according to claim 7:

wherein the first and third legs of the first bracket, in an operative configuration with the first support member, extend along and in contact with a first distal portion of the first support member;

wherein the first and third legs of the second bracket, in an operative configuration with the first support member, extend along and in contact with a second distal portion of the first support member;

wherein the first and third legs of the third bracket, in an operative configuration with the second support member, extend along and in contact with a first distal portion of the second support member;

and wherein the first and third legs of the fourth bracket, in an operative configuration with the second support member, extend along and in contact with a second distal portion of the second support member.

9. An apparatus for mounting a photovoltaic module, comprising:

a first support member;

a second support member;

a ballast support structure, wherein the ballast support structure is disposed between the first support member and the second support member;

a first bracket, wherein the first bracket includes a first leg and a second leg, wherein the first leg includes a hook-shaped portion at a distal end of the first leg, wherein the second leg includes a hook-shaped portion at a distal end of the second leg, and wherein a first distal end of the first support member is disposable in the hook-shaped portion of the first leg of the first bracket;

a second bracket, wherein the second bracket includes a first leg and a second leg, wherein the first leg includes a hook-shaped portion at a distal end of the first leg, wherein the second leg includes a hook-shaped portion at a distal end of the second leg, and wherein a second distal end of the first support member is disposable in the hook-shaped portion of the first leg of the second bracket;

a third bracket, wherein the third bracket includes a first leg and a second leg, wherein the first leg includes a hook-shaped portion at a distal end of the first leg, wherein the second leg includes a hook-shaped portion at a distal end of the second leg, and wherein a first distal end of the second support member is disposable in the hook-shaped portion of the first leg of the third bracket; and a fourth bracket, wherein the fourth bracket includes a first leg and a second leg, wherein the first leg includes a hook-shaped portion at a distal end of the first leg, wherein the second leg includes a hook-shaped portion at a distal end of the second leg, and wherein a second distal end of the second support member is disposable in the hook-shaped portion of the first leg of the fourth bracket;

wherein the first and second support members each have a bottom member and wherein the respective bottom members are disposed on a respective outer periphery of the respective support members;

wherein respective first and second walls extend from the bottom members of the first and second support members and wherein the first and second walls extend into a respective inner periphery of the respective support members.

10. The apparatus according to claim 9:

wherein the first and second distal ends of the first support member are disposed on the bottom member of the first support member;

and wherein the first and second distal ends of the second support member are disposed on the bottom member of the second support member.

11. An apparatus for mounting a photovoltaic module, comprising:

a first support member;

a second support member;

a ballast support structure, wherein the ballast support structure is disposed between the first support member and the second support member;

a first bracket, wherein the first bracket includes a first leg and a second leg, wherein the first leg includes a hook-shaped portion at a distal end of the first leg, wherein the second leg includes a hook-shaped portion at a distal end of the second leg, and wherein a first distal end of the first support member is disposable in the hook-shaped portion of the first leg of the first bracket;

a second bracket, wherein the second bracket includes a first leg and a second leg, wherein the first leg includes a hook-shaped portion at a distal end of the first leg, wherein the second leg includes a hook-shaped portion at a distal end of the second leg, and wherein a second distal end of the first support member is disposable in the hook-shaped portion of the first leg of the second bracket;

a third bracket, wherein the third bracket includes a first leg and a second leg, wherein the first leg includes a hook-shaped portion at a distal end of the first leg, wherein the second leg includes a hook-shaped portion at a distal end of the second leg, and wherein a first distal end of the second support member is disposable in the hook-shaped portion of the first leg of the third bracket; and a fourth bracket, wherein the fourth bracket includes a first leg and a second leg, wherein the first leg includes a hook-shaped portion at a distal end of the first leg, wherein the second leg includes a hook-shaped portion at a distal end of the second leg, and wherein a second distal end of the second support member is disposable in the hook-shaped portion of the first leg of the fourth bracket;

wherein the second leg of the second bracket is disposed at an angle of substantially 90° from the first leg of the second bracket;

and wherein the second leg of the fourth bracket is disposed at an angle of substantially 90° from the first leg of the fourth bracket.

12. An apparatus for mounting a photovoltaic module, comprising:

a first support member;

a second support member;

a ballast support structure, wherein the ballast support structure is disposed between the first support member and the second support member;

a first bracket, wherein the first bracket includes a first leg and a second leg, wherein the first leg includes a hook-shaped portion at a distal end of the first leg, wherein the second leg includes a hook-shaped portion at a distal end of the second leg, and wherein a first distal end of the first support member is disposable in the hook-shaped portion of the first leg of the first bracket;

a second bracket, wherein the second bracket includes a first leg and a second leg, wherein the first leg includes a hook-shaped portion at a distal end of the first leg, wherein the second leg includes a hook-shaped portion at a distal end of the second leg, and wherein a second distal end of the first support member is disposable in the hook-shaped portion of the first leg of the second bracket;

a third bracket, wherein the third bracket includes a first leg and a second leg, wherein the first leg includes a hook-shaped portion at a distal end of the first leg, wherein the second leg includes a hook-shaped portion at a distal end of the second leg, and wherein a first distal end of the second support member is disposable in the hook-shaped portion of the first leg of the third bracket; and a fourth bracket, wherein the fourth bracket includes a first leg and a second leg, wherein the first leg includes a hook-shaped portion at a distal end of the first leg, wherein the second leg includes a hook-shaped portion at a distal end of the second leg, and wherein a second distal end of the second support member is disposable in the hook-shaped portion of the first leg of the fourth bracket;

wherein the second legs of the respective brackets each include a cam surface at a distal end of the hook-shaped portion.

13. An apparatus for mounting a photovoltaic module, comprising:

a first support member;

a second support member;

a ballast support structure, wherein the ballast support structure is disposed between the first support member and the second support member;

a first bracket, wherein the first bracket includes a first leg and a second leg, wherein the first leg includes a hook-shaped portion at a distal end of the first leg, wherein the second leg includes a hook-shaped portion at a distal end of the second leg, and wherein a first distal end of the first support member is disposable in the hook-shaped portion of the first leg of the first bracket;

a second bracket, wherein the second bracket includes a first leg and a second leg, wherein the first leg includes a hook-shaped portion at a distal end of the first leg, wherein the second leg includes a hook-shaped portion at a distal end of the second leg, and wherein a second distal end of the first support member is disposable in the hook-shaped portion of the first leg of the second bracket;

a third bracket, wherein the third bracket includes a first leg and a second leg, wherein the first leg includes a hook-shaped portion at a distal end of the first leg, wherein the second leg includes a hook-shaped portion at a distal end of the second leg, and wherein a first distal end of the second support member is disposable in the hook-shaped portion of the first leg of the third bracket; and a fourth bracket, wherein the fourth bracket includes a first leg and a second leg, wherein the first leg includes a hook-shaped portion at a distal end of the first leg, wherein the second leg includes a hook-shaped portion at a distal end of the second leg, and wherein a second distal end of the second support member is disposable in the hook-shaped portion of the first leg of the fourth bracket;

wherein the ballast support structure is a plurality of spaced-apart rods that extend between the first and second support members.

14. An apparatus for mounting a photovoltaic module, comprising:

a first support member;

a second support member;

a ballast support structure, wherein the ballast support structure is disposed between the first support member and the second support member;

a first bracket, wherein the first bracket includes a first leg and a second leg, wherein the first leg includes a hook-shaped portion at a distal end of the first leg, wherein the second leg includes a hook-shaped portion at a distal end of the second leg, and wherein a first distal end of the first support member is disposable in the hook-shaped portion of the first leg of the first bracket;

a second bracket, wherein the second bracket includes a first leg and a second leg, wherein the first leg includes a hook-shaped portion at a distal end of the first leg, wherein the second leg includes a hook-shaped portion at a distal end of the second leg, and wherein a second distal end of the first support member is disposable in the hook-shaped portion of the first leg of the second bracket;

a third bracket, wherein the third bracket includes a first leg and a second leg, wherein the first leg includes a hook-shaped portion at a distal end of the first leg, wherein the second leg includes a hook-shaped portion at a distal end of the second leg, and wherein a first distal end of the second support member is disposable in the hook-shaped portion of the first leg of the third bracket; and a fourth bracket, wherein the fourth bracket includes a first leg and a second leg, wherein the first leg includes a hook-shaped portion at a distal end of the first leg, wherein the second leg includes a hook-shaped portion at a distal end of the second leg, and wherein a second distal end of the second support member is disposable in the hook-shaped portion of the first leg of the fourth bracket;

wherein the ballast support structure is a contiguous rod that is attached at first and second distal portions of the first support member and at first and second distal portions of the second support member.

15. An apparatus for mounting a photovoltaic module, comprising:

a first support member;

a second support member;

a ballast support structure, wherein the ballast support structure is disposed between the first support member and the second support member;

a first bracket wherein the first bracket includes a first leg and a second leg, wherein the first leg includes a hook-shaped portion at a distal end of the first leg, wherein the second leg includes a hook-shaped portion at a distal end of the second leg, and wherein a first distal end of the first support member is disposable in the hook-shaped portion of the first leg of the first bracket;

a second bracket, wherein the second bracket includes a first leg and a second leg, wherein the first leg includes a hook-shaped portion at a distal end of the first leg, wherein the second leg includes a hook-shaped portion at a distal end of the second leg, and wherein a second distal end of the first su ort member is disposable in the hook-shaped portion of the first leg of the second bracket;

a third bracket, wherein the third bracket includes a first leg and a second leg, wherein the first leg includes a hook-shaped portion at a distal end of the first leg, wherein the second leg includes a hook-shaped portion at a distal end of the second leg, and wherein a first distal end of the second support member is disposable in the hook-shaped portion of the first leg of the third bracket; and a fourth bracket, wherein the fourth bracket includes a first leg and a second leg, wherein the first leg includes a hook-shaped portion at a distal end of the first leg, wherein the second leg includes a hook-shaped portion at a distal end of the second leg, and wherein a second distal end of the second support member is disposable in the hook-shaped portion of the first leg of the fourth bracket;

wherein the ballast support structure is a pair of spaced-apart L-shaped members that extend between the first and second support members.

16. An apparatus for mounting a photovoltaic module, comprising:

a first support member;

a second support member;

a ballast support structure, wherein the ballast support structure is disposed between the first support member and the second support member;

a first bracket, wherein the first bracket includes a first leg and a second leg, wherein the first leg includes a hook-shaped portion at a distal end of the first leg, wherein the second leg includes a hook-shaped portion at a distal end of the second leg, and wherein a first distal end of the first support member is disposable in the hook-shaped portion of the first leg of the first bracket;

a second bracket, wherein the second bracket includes a first leg and a second leg, wherein the first leg includes a hook-shaped portion at a distal end of the first leg, wherein the second leg includes a hook-shaped portion at a distal end of the second leg, and wherein a second distal end of the first support member is disposable in the hook-shaped portion of the first leg of the second bracket;

a third bracket, wherein the third bracket includes a first leg and a second leg, wherein the first leg includes a hook-shaped portion at a distal end of the first leg, wherein the second leg includes a hook-shaped portion at a distal end of the second leg, and wherein a first distal end of the second support member is disposable in the hook-shaped portion of the first leg of the third bracket; and a fourth bracket, wherein the fourth bracket includes a first leg and a second leg, wherein the first leg includes a hook-shaped portion at a distal end of the first leg, wherein the second leg includes a hook-shaped portion at a distal end of the second leg, and wherein a second distal end of the second support member is disposable in the hook-shaped portion of the first leg of the fourth bracket; and a roof penetration structure extending between the first and second support members, wherein the roof penetration structure defines a hole therein.

17. An apparatus for mounting a photovoltaic module in combination with a first photovoltaic module and a second photovoltaic module, comprising:

a first support member;

a second support member;

a ballast support structure, wherein the ballast support structure is disposed between the first support member and the second support member;

a first bracket, wherein the first bracket includes a first leg and a second leg, wherein the first leg includes a hook-shaped portion at a distal end of the first leg, wherein the second leg includes a hook-shaped portion at a distal end of the second leg, and wherein a first distal end of the first support member is disposable in the hook-shaped portion of the first leg of the first bracket;

a second bracket, wherein the second bracket includes a first leg and a second leg, wherein the first leg includes a hook-shaped portion at a distal end of the first leg, wherein the second leg includes a hook-shaped portion at a distal end of the second leg, and wherein a second distal end of the first support member is disposable in the hook-shaped portion of the first leg of the second bracket;

a third bracket, wherein the third bracket includes a first leg and a second leg, wherein the first leg includes a hook-shaped portion at a distal end of the first le wherein the second leg includes a hook-shaped portion at a distal end of the second leg, and wherein a first distal end of the second support member is disposable in the hook-shaped portion of the first leg of the third bracket; and a fourth bracket, wherein the fourth bracket includes a first leg and a second leg, wherein the first leg includes a hook-shaped portion at a distal end of the first leg, wherein the second leg includes a hook-shaped portion at a distal end of the second leg, and wherein a second distal end of the second support member is disposable in the hook-shaped portion of the first leg of the fourth bracket;

wherein a frame member of the first photovoltaic module is disposed in the hook-shaped portion of the second leg of the first bracket and in the hook-shaped portion of the second leg of the third bracket;

and wherein a frame member of the second photovoltaic module is disposed in the hook-shaped portion of the second leg of the second bracket and in the hook-shaped portion of the second leg of the fourth bracket.

\* \* \* \* \*